United States Patent [19]

Murayama et al.

[11] Patent Number: 4,791,047
[45] Date of Patent: Dec. 13, 1988

[54] COLOR SOLID IMAGE PICKUP ELEMENT

[75] Inventors: Jin Murayama; Hiroshi Tamura; Yoshimitsu Kudoh, all of Kanagawa, Japan

[73] Assignee: Fuji Photo Film Co., Ltd., Kanagawa, Japan

[21] Appl. No.: 82,472

[22] Filed: Aug. 7, 1987

[30] Foreign Application Priority Data

Aug. 7, 1986 [JP] Japan ................... 61-184327

[51] Int. Cl.⁴ .................. G03F 9/00; G03C 5/00; B32B 33/00; B32B 31/00
[52] U.S. Cl. ..................... 430/321; 430/7; 428/908.8; 428/911; 156/90; 156/268
[58] Field of Search ............ 156/90, 268; 437/226; 430/7, 321; 428/908.8, 911

[56] References Cited

U.S. PATENT DOCUMENTS

| 3,669,704 | 6/1972 | Reiling | 428/202 |
| 3,909,680 | 9/1975 | Tsunashima | 156/90 |
| 4,273,827 | 6/1981 | Sweeney et al. | 156/90 |
| 4,370,025 | 1/1983 | Sato et al. | 430/7 |
| 4,397,928 | 8/1983 | Sato et al. | 430/7 |
| 4,400,454 | 8/1983 | Sato et al. | 430/7 |

Primary Examiner—John E. Kittle
Assistant Examiner—P. J. Ryan
Attorney, Agent, or Firm—Sughrue, Mion, Zinn, Macpeak, and Seas

[57] ABSTRACT

A color solid image pickup element is made up of a semiconductor element, and a color filter bonded through a buffer layer to the semiconductor element, so that, when the semiconductor element and the color filter are joined together, the semiconductor element may not be damaged by foreign matter such as shavings.

3 Claims, 1 Drawing Sheet

COLOR SOLID IMAGE PICKUP ELEMENT

BACKGROUND OF THE INVENTION

1. Field of the Invention

This invention relates to a color solid image pickup element which comprises a semiconductor chip and a color filter bonded to the semiconductor chip.

2. Background of the Invention

A color solid image pickup element formed by bonding a color filter on a semiconductor chip is well known in the art. More specifically, the color solid image pickup element is manufactured as follows. A color filter layer is formed on a supporting substrate such as a glass plate. The assembly of the color filter layer and the substrate is subjected to dicing to provide a color filter in the form of a chip. The color filter thus provided is bonded with adhesive to the surface of a semiconductor element in the form of a chip.

In general, the color filter layer is a gelatin or casein emulsion layer or an organic film coating, the material of which is a mixture of resin and a coloring agent. Therefore, the color filter layer is softer than the components of the semiconductor element.

On the other hand, in the case where the color solid image pickup element is made up of the color filter layer of the aforementioned organic film coating, sometimes its spectral characteristic is unsatisfactory depending on the purpose of use. In order to overcome this difficulty, the following method is extensively employed. As shown in FIG. 1, an interference film filter 2 having a multi-layer structure is formed by using separate $SiO_2$ or $TiO_2$ dielectric layers 1 according to the desired color. The filter 2 thus formed is bonded to the surface of a semiconductor element 3.

As was described above, the assembly of the color filter layer and the substrate is diced to form the color filter in the form of a chip. The color filter layer of the color filter thus formed is bonded to the surface of the semiconductor element. However, prior to the bonding operation, it is necessary to wash the color filter because foreign material such as glass shavings might have stuck to the color filter in the dicing operation.

However, even if the color filter has been washed, often the foreign material remains on the surface of the filter, thus damaging the surface of the semiconductor element when the color filter is bonded to the semiconductor element.

In the case where the color filter layer is the organic film coating as was described above, the color filter layer is softer than the semiconductor element, and therefore when the color filter is bonded to the surface of the semiconductor element, the foreign matter such as glass shavings, entering the color filter layer, will not damage the surface of the semiconductor element. On the other hand, in the case of the interference film filter, the color filter layers are, in general, substantially equal in hardness to the glass substrate. Therefore, when the filter is bonded to the semiconductor element, the foreign material which impinges the semiconductor element damages the surface of the latter.

SUMMARY OF THE INVENTION

Accordingly, an object of this invention is to eliminate the above-described difficulty accompanying a conventional color solid image pickup element.

More specifically, an object of invention is to provide a color solid image pickup element which can be manufactured without damaging the surface of the semiconductor element even when relatively hard color filter layers are used.

The foregoing object and other objects of the invention have been achieved by the provision of a color solid image pickup element comprising a semiconductor chip, and a color filter bonded to the semiconductor chip and which further comprises a buffer layer interposed between the color filter and the semiconductor chip.

The nature, principle and utility of the invention will become more apparent from the following detailed description when read in conjunction with the accompanying drawings.

DETAILED DESCRIPTION OF THE PREFERRED EMBODIMENT

Figure 1:
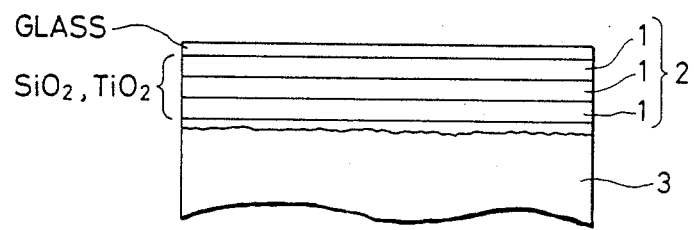
FIG. 1 is a sectional diagram showing a conventional color solid image pickup element.
Figure 2:
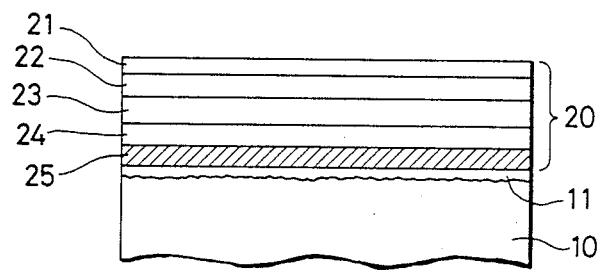
FIG. 2 is a sectional diagram showing one example of a color solid image pickup element according to this invention.

As shown in FIG. 2, one example of a color solid image pickup element according to this invention is in the form of a chip. More specifically, the color solid image pickup element of the invention comprises a MOS or CCD type semiconductor element 10 and a color filter 20 bonded onto the semiconductor element 10 through mask alignment. Similarly as in the conventional color solid image pickup element, a smoothed layer 11 is formed on the surface of the semiconductor element 10.

The color filter 20 is an interference filter having a lamination structure which comprises a transparent glass substrate 21 and three dielectric layers 22, 23 and 24, which are different in color and are formed, in the stated order, on the substrate 21 by vacuum deposition. The dielectric layers 22, 23 and 24 are made of silicon dioxide $SiO_2$ or titanium dioxide $TiO_2$ which transmits no moisture and impurities and which is stable and substantially equivalent in hardness to glass. A buffer layer 25 of organic material is formed on the top layer 24, as viewed in the inverse direction as FIG. 2. More specifically, the buffer layer 25 is transparent photo-resist layer, the thickness of which is determined according to the size of shavings formed during dicing, usually 2 to 3 $\mu m$.

Examples of the material of the buffer layer 25 are the photo-resist mentioned above, acrylic resins, polystyrene resins, polyamide resin, polyimide resin, transparent resins well known in the art, and surface protecting materials. These materials are applied to or vacuum-deposited on the top dielectric layer 24 to form the buffer layer 25.

The color filter including the buffer layer 25 is combined with the semiconductor element 10 by bonding the buffer layer 25 onto the semiconductor element 10 with adhesive.

In this bonding operation, the color filter 20 is pushed against the semiconductor element. However, the semiconductor element will never be damaged by foreign matter such as shaving on the color filter because the foreign matter is absorbed by the soft buffer layer 25 before being buried in the semiconductor element 10.

Instead of the buffer layer 25, the layer of the adhesive used for bonding the color filter to the semiconductor may be employed for absorbing the foreign matter. However, the method is not practical, because of the following reasons: The adhesive used is generally of ultraviolet setting type or of thermo-setting type. It is used with the viscosity lowered, because if the viscosity is high, then the layer formed by coating with the adhesive is naturally large in thickness, and the coating operation with the adhesive is rather difficult. Therefore, it is difficult to form a layer having a thickness suitable as buffer layer using the adhesive. In addition, the method suffers from a problem that bubbles may be formed in the layer.

It is undesirable to make the thickness of the buffer layer so large, because to do so may lower the color mixing or resolving power of the light applied through the filter.

As was described above, the color solid image pickup element is formed by bonding the color filter through the buffer layer to the semiconductor element. Therefore, even if the color filter is made up of hard color filter layers, when the color filter and the semiconductor element are joined together, foreign matter such as shavings is absorbed by the buffer layer, so that the semiconductor element is not damaged by the foreign matters at all. Accordingly, the yield of manufacturing the color solid image pickup element is increased as much.

What is claimed is:

1. A color solid image pickup element, comprising:
a semiconductor chip;
a color filter bonded to said semiconductor chip, wherein said color filter is a film filter of a lamination structure comprising a transparent glass substrate and at least one dielectric layer vacuum-deposited on said substrate;
a buffer layer comprising a transparent resin interposed between said color filter and said semiconductor chip; and an adhesive interposed between said buffer layer and said semiconductor chip, whereby said color filter is bonded to said semiconductor chip.

2. A color solid image pickup element as claimed in claim 1, wherein said film filter is an interference film filter and said at least one dielectric layers comprises a plurality of dielectric layers.

3. A color solid image pickup element as recited in claim 1, wherein said buffer layer comprises photoresist.

* * * * *